(12) United States Patent
Bar et al.

(10) Patent No.: US 9,165,861 B2
(45) Date of Patent: Oct. 20, 2015

(54) PROCESS FOR PRODUCING AT LEAST ONE THROUGH-SILICON VIA WITH IMPROVED HEAT DISSIPATION, AND CORRESPONDING THREE-DIMENSIONAL INTEGRATED STRUCTURE

(71) Applicants: STMicroelectronics SA, Montrouge (FR); STMicroelectronics (Crolles 2) SAS, Crolles (FR)

(72) Inventors: Pierre Bar, Grenoble (FR); Simon Gousseau, Grenoble (FR); Yann Beilliard, La Tronche (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/287,343

(22) Filed: May 27, 2014

(65) Prior Publication Data

US 2014/0361440 A1    Dec. 11, 2014

(30) Foreign Application Priority Data

Jun. 6, 2013   (FR) ...................................... 13 55220

(51) Int. Cl.
| | | |
|---|---|---|
| H01L 23/427 | (2006.01) | |
| H01L 23/48 | (2006.01) | |
| H01L 21/768 | (2006.01) | |
| H01L 23/367 | (2006.01) | |
| H01L 23/00 | (2006.01) | |

(52) U.S. Cl.
CPC ........ H01L 23/481 (2013.01); H01L 21/76898 (2013.01); H01L 23/3677 (2013.01); H01L 23/4275 (2013.01); H01L 24/16 (2013.01); *H01L 24/73* (2013.01); *H01L 2224/16235* (2013.01); *H01L 2224/73204* (2013.01)

(58) Field of Classification Search
CPC ..................... H01L 21/76885; H01L 23/3737; H01L 23/427; H01L 23/4275
See application file for complete search history.

(56) References Cited

U.S. PATENT DOCUMENTS

| | | | | |
|---|---|---|---|---|
| 6,114,413 A | * | 9/2000 | Kang et al. ..................... | 523/210 |
| 6,798,066 B1 | * | 9/2004 | Motsiff et al. ................ | 257/758 |
| 7,666,768 B2 | | 2/2010 | Raravikar et al. | |
| 2003/0057265 A1 | * | 3/2003 | Aspandiar et al. ............ | 228/260 |
| 2008/0164603 A1 | * | 7/2008 | Sturcken et al. .............. | 257/713 |
| 2010/0117201 A1 | | 5/2010 | Ching et al. | |
| 2011/0233765 A1 | * | 9/2011 | Tani et al. ..................... | 257/737 |
| 2011/0272819 A1 | * | 11/2011 | Park et al. ..................... | 257/774 |
| 2014/0084458 A1 | * | 3/2014 | Huang et al. .................. | 257/737 |

FOREIGN PATENT DOCUMENTS

| | | |
|---|---|---|
| CN | 101728481 A | 6/2010 |
| WO | 2010120448 A2 | 10/2010 |
| WO | 2011006101 A2 | 1/2011 |

\* cited by examiner

*Primary Examiner* — Bryan Junge
(74) *Attorney, Agent, or Firm* — Allen, Dyer, Doppelt, Milbrath & Gilchrist, P.A.

(57) ABSTRACT

A method for producing at least one through-silicon via inside a substrate may include forming a cavity in the substrate from a first side of the substrate until an electrically conductive portion is emerged onto. The method may also include forming an electrically conductive layer at a bottom and on walls of the cavity, and at least partly on a first side outside the cavity. The process may further include at least partially filling the cavity with at least one phase-change material. Another aspect is directed to a three-dimensional integrated structure.

20 Claims, 2 Drawing Sheets

PROCESS FOR PRODUCING AT LEAST ONE THROUGH-SILICON VIA WITH IMPROVED HEAT DISSIPATION, AND CORRESPONDING THREE-DIMENSIONAL INTEGRATED STRUCTURE

FIELD OF THE INVENTION

The invention relates to integrated circuits, particularly three-dimensional integrated structures comprising through-silicon vias, and more particularly to heat dissipation inside such structures.

BACKGROUND OF THE INVENTION

Three-dimensional integrated structures generally comprise at least two integrated circuits fabricated independently then connected together. Conventionally, to connect the back side of a first integrated circuit to the front side of a second integrated circuit, through-silicon vias are produced inside the first integrated circuit.

During operation of these integrated circuits, the various components of the integrated circuits release heat. This heat generally limits the operating power of the integrated circuits and therefore their performance.

U.S. Pat. No. 7,666,768 describes through-silicon vias that include carbon structures to decrease thermal expansion of the through-silicon vias and increase electrical conductivity. Furthermore, PCT Application Publication No. WO 2010/120448 describes wide, thermally conductive through-silicon vias.

SUMMARY OF THE INVENTION

According to a method of implementation and embodiment, a process for producing at least one through-silicon via, and a three-dimensional integrated structure having improved heat dissipation are provided. To improve the heat dissipation of a through-silicon via, it may be particularly advantageous, on the one hand, to make changes to the through-silicon vias because the latter form barriers to the heat dissipation inside three-dimensional integrated structures, and on the other hand, to at least partially fill the through-silicon vias with a phase-change material.

According to one aspect, a process is provided for producing at least one through-silicon via inside a support or substrate. The process includes forming a cavity in the substrate from a first side of the substrate, for example, the back side, until an electrically conductive portion is emerged onto, and forming an electrically conductive layer at the bottom and on the walls of the cavity and at least partly on the first side outside the cavity.

According to one feature of this aspect, the process furthermore includes at least partially filling the cavity with at least one phase-change material. These phase-change materials store thermal energy by changing phase in the event of an increase in temperature due to the operation of the integrated structure that includes this via. The stored energy is then released when the integrated structure is no longer operational. This makes it possible to improve the heat dissipation in the three-dimensional structure. In particular, phase-change materials that can liquefy in the temperature ranges corresponding to operation of the integrated circuits may be chosen.

The process may include, prior to the step of forming an electrically conductive layer, forming an insulating layer on the walls of the cavity and on the first side outside the cavity. This layer especially may make it possible to avoid electrical contact between a material such as silicon and a conductive material.

The process may furthermore include forming a polymer layer, for example, a polybenzoxazole layer, at the top of the cavity and in contact with the phase-change material. The polymer may be being able to deform in the event of a phase change of the phase-change material.

Thus, in this embodiment, the cavity is filled in two steps, a first step in which the cavity is filled with a phase-change material, and a second step in which the cavity is filled with polymer to encapsulate the phase-change material. It is thus possible to provide increased protection for the phase-change material with a layer of flexible polymer that withstands the mechanical stresses due to thermal expansion of the phase-change material, which expands when it changes phase, but also the thermal and mechanical stresses imposed on integrated circuits during packaging. In this way the phase-change material is protected, and the latter remains protected, even after several phase changes.

Those skilled in the art will know how to choose the Young's modulus of the phase-change material. The mechanical properties of the phase-change material are generally chosen to be suitable for covering a through-silicon via including a phase-change material. For example, the polymer may have a Young's modulus of less than 3 GPa.

The polymer layer may also cover the conductive layer which extends over the first side, and this polymer layer may be opened to obtain an electrical contact on this first side. For example, a conductive pillar may be formed in contact with the conductive layer, protruding from the first side.

Furthermore, the cavity may be filled with a phase-change material containing copper particles. In this way, the thermal conductivity inside the through-silicon vias is increased, and increased heat dissipation by the phase-change material is obtained.

According to another aspect, a three-dimensional integrated structure is provided that includes a through-silicon via extending into a substrate from a first side of the substrate as far as an electrically conductive portion. The through-silicon via includes an electrically conductive layer extending at least partly onto the first side.

According to a general feature of this aspect, the through-silicon via includes, at least in part, a filler material in contact with the electrically conductive layer. The filler material may include at least one phase-change material.

The three-dimensional integrated structure may include an insulating layer arranged around the through-silicon via between the substrate and the electrically conductive layer, and on the first side of the substrate. The structure may include a polymer layer surmounting and in contact with the filler material. The polymer may deform in the event of a phase change of the phase-change material.

The polymer layer may include polybenzoxazole, and have a Young's modulus of less than 3 GPa. The structure may furthermore include copper particles in the phase-change material.

DETAILED DESCRIPTION OF THE PREFERRED EMBODIMENTS

Figure 1:
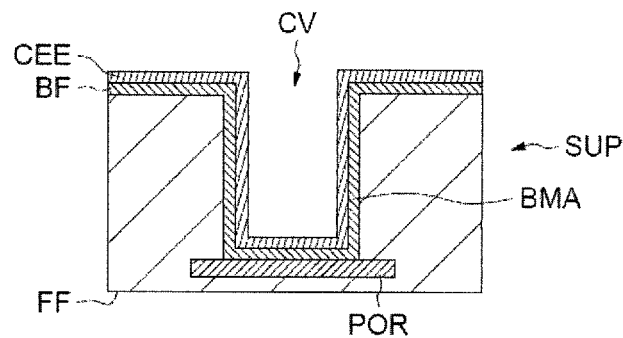
FIGS. 1-6 are schematic cross-sectional views illustrating various steps of a method of implementation and an embodiment of a three-dimensional integrated structure according to the present invention.

FIG. 1 shows a substrate SUP, for example, a silicon wafer. The substrate SUP may include a region that includes components, for example transistors, forming the Front End Of Line (FEOL) region well known to those skilled in the art. The substrate SUP may also include a Back End Of Line (BEOL) region that includes an electrically conductive portion POR. The electrically conductive portion POR is produced in the vicinity of the front side FF of the substrate.

The substrate SUP also includes a back side BF opposite the front side FF. To assemble an integrated circuit to the back side BF of the substrate SUP, an electrical connection is formed between this back side and the metallic lines arranged in the vicinity of the front side FF of the substrate SUP, for example the portion POR.

For this purpose, a cavity CV can be formed that extends into the substrate SUP from the back side BF as far as the electrically conductive portion POR. Formation of the cavity may be followed by the formation of an insulating layer (not shown) on the walls of the cavity CV and on the back side BF.

The cavity CV may have a height between 50 and 200 micrometers. The cavity CV may have a height-to-diameter ratio between 1 and 3.

A metal barrier and tie layer BMA have also been formed at the bottom of the cavity CV, on the walls of the cavity CV and partly on the back side BF. This barrier and adhesive layer make it possible to form an electrically conductive layer CEE, from copper for example, at the bottom and on the walls of the cavity CV and at least partly on the back side BF. It is this electrically conductive layer that forms an electrical connection between the electrically conductive portion POR and the back side BF of the substrate SUP.

Figure 2:
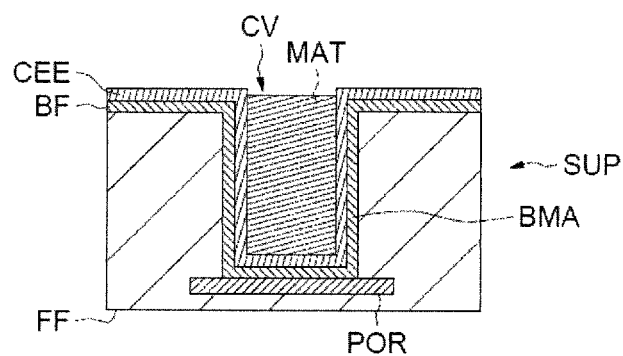
Figure 3:
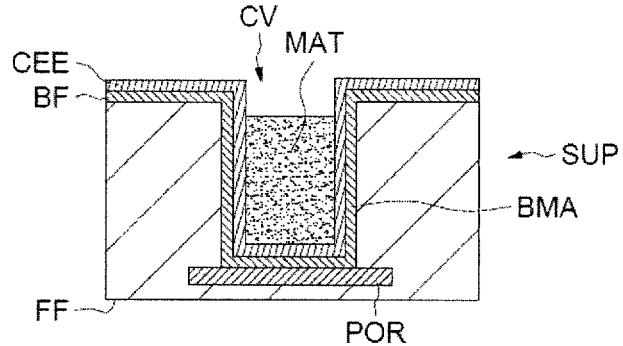

Whereas in the prior art, it is possible to fill the cavity CV with a resist, here the cavity is at least partly filled with at least one phase-change material MAT, as illustrated in FIG. 2. This filling step may, for example, be a screen-printing step in which a filler material that includes at least the phase-change material is made to penetrate into the cavity CV. During this filling step, the phase-change material MAT may be in a liquid phase. In this liquid phase it is expanded and lies flush with the opening of the cavity. When it cools, as illustrated in FIG. 3, the phase-change material MAT contracts and fills only part of the cavity CV.

By way of example, sodium acetate trihydrate may be used as the phase-change material since it is a material that liquefies at about 55° C. and which is suitable for temperature variations associated with the use of integrated circuits. Other phase-change materials may be used, for example, salt hydrates or paraffin.

Figure 4:
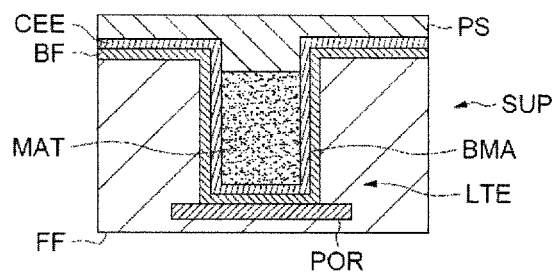

It may then be possible to form a polymer layer PS above and in contact with the phase-change material MAT (FIG. 4). The polymer layer PS is flexible enough to deform in the event of a phase change of the phase-change material MAT. Specifically, once the integrated circuit has been completed, during its operation, the temperature may rise in such a way that the phase-change material MAT changes phase to expand as illustrated with reference to FIG. 2. It is by this phase change that heat dissipation within the obtained structure is improved. The polymer layer PS makes it possible to encapsulate the phase-change material to allow the thermal and mechanical stresses imposed on integrated circuits during packaging to be withstood.

Of course, even if in FIG. 4 the polymer layer covers the electrically conductive layer CEE, it may be to open this polymer layer in order then to form a conductive pillar. A through-silicon via LTE is obtained.

Figure 5:
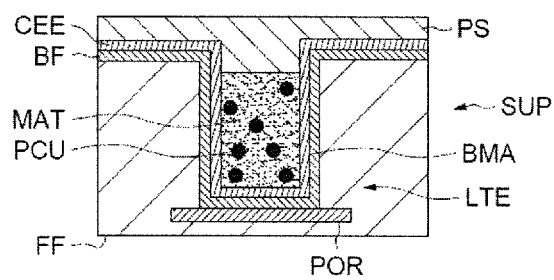

FIG. 5 is a schematic of a variant in which the cavity CV has been filled with a phase-change material MAT including copper particles PCU. For example, copper particles about a few hundred nanometers in size may be used. Using copper particles PCU may improve the thermal conductivity inside the through-silicon vias to improve heat dissipation by the phase-change material MAT.

Figure 6:
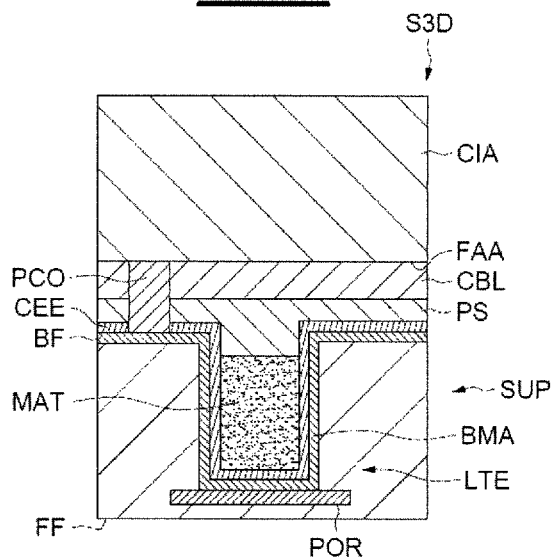

The substrate SUP may be assembled with an additional integrated circuit CIA (FIG. 6). More particularly, here the front side FAA of the additional integrated circuit CIA is assembled to the back side BF of the substrate SUP, here covered by the barrier and adhesive layer BMA, by the electrically conductive layer CEE and by the polymer layer PS.

This assembly may include forming a conductive pillar PCO in electrical contact with the electrically conductive layer CEE and with a metal portion (not shown here) of the integrated circuit CIA. A filling layer CBL may also fill spaces between the integrated circuit CIA and the substrate SUP.

A three-dimensional integrated structure S3D is obtained, including a through-silicon via LTE extending into the substrate SUP from a first side of the substrate (here the back side BF) as far as an electrically conductive portion POR. The through-silicon via LTE includes an electrically conductive layer CEE extending at least partly onto the first side. The through-silicon via includes, at least in part, a filler material in contact with the electrically conductive layer. The filler material includes at least one phase-change material MAT. According to an embodiment, heat dissipation inside the three-dimensional integrated structure obtained is improved.

That which is claimed is:

1. A method of making at least one through-silicon via inside a substrate of an integrated circuit (IC) comprising:
   forming a cavity in the substrate from a first side of the substrate, the cavity being formed to extend inwardly from the first side to expose an electrically conductive portion;
   forming an electrically conductive layer at a bottom and on walls of the cavity, and at least partly on the first side outside the cavity;
   at least partially filling the cavity with at least one phase-change material, the at least one phase-change material storing or releasing thermal energy upon a temperature-based phase change within a temperature range of operation of the IC; and
   forming a polymer layer at a top of the cavity and in contact with the at least one phase-change material.

2. The method according to claim 1, wherein the polymer layer is deformable based upon a phase change of the at least one phase-change material.

3. The method according to claim 2, wherein the polymer layer has a Young's modulus of less than 3 GPa.

4. The method according to claim 2, wherein the polymer layer comprises polybenzoxazole.

5. The method according to claim 1, wherein the at least one phase-change material comprises copper particles.

6. A method of making at least one through-silicon via inside a substrate of an integrated circuit (IC) comprising:
   forming a cavity in the substrate to expose an electrically conductive portion;
   forming an electrically conductive layer within the cavity;
   at least partially filling the cavity with at least one phase-change material, the at least one phase-change material storing or releasing thermal energy upon a temperature-based phase change within a temperature range of operation of the IC; and
   forming a polymer layer within the cavity and coupled to the at least one phase-change material.

7. The method according to claim 6, wherein the polymer layer is deformable based upon a phase change of the at least one phase-change material.

8. The method according to claim 7, wherein the polymer layer has a Young's modulus of less than 3 GPa.

9. The method according to claim 7, wherein the polymer layer comprises polybenzoxazole.

10. The method according to claim 6, wherein the at least one phase-chase material comprises copper.

11. A three-dimensional integrated structure comprising:
a substrate;
an electrically conductive portion carried by said substrate; and
a through-silicon via extending into said substrate from a first side of said substrate to said electrically conductive portion, said through-silicon via comprising an electrically conductive layer extending at least partly onto the first side,
a filler material in contact with said electrically conductive layer, said filler material comprising at least one phase-change material, the at least one phase-change material storing or releasing thermal energy upon a temperature-based phase change within a temperature range of operation of the three-dimensional integrated structure, and
a polymer layer over and coupled to said filler material.

12. The three-dimensional integrated structure according to claim 11, wherein said polymer layer is configured to deform based upon a phase change of the at least one phase-change material.

13. The three-dimensional integrated structure according to claim 12, wherein said polymer layer comprises polybenzoxazole.

14. The three-dimensional integrated structure according to claim 12, wherein said polymer layer has a Young's modulus of less than 3 GPa.

15. The three-dimensional integrated structure according to claim 11, wherein said at least one phase-change material comprises copper particles.

16. An integrated structure comprising:
a substrate;
a first electrically conductive layer carried by said substrate; and
a through-silicon via extending into said substrate to said first electrically conductive layer, said through-silicon via comprising a second electrically conductive layer,
at least one phase-change material coupled to said second electrically conductive layer, the at least one phase-change material storing or releasing thermal energy upon a temperature-based phase change within a temperature range of operation of the integrated structure, and
a polymer layer over and coupled to said at least one phase-change material.

17. The integrated structure according to claim 16, wherein said polymer layer is configured to deform based upon a phase change of the at least one phase-change material.

18. The integrated structure according to claim 17, wherein said polymer layer comprises polybenzoxazole.

19. The integrated structure according to claim 17, wherein said polymer layer has a Young's modulus of less than 3 GPa.

20. The integrated structure according to claim 16, wherein said at least one phase-change material comprises copper.

* * * * *